US011851603B2

(12) United States Patent
Hu et al.

(10) Patent No.: US 11,851,603 B2
(45) Date of Patent: Dec. 26, 2023

(54) THERMALLY CONDUCTIVE COMPOSITION AND METHODS AND DEVICES IN WHICH SAID COMPOSITION IS USED

(71) Applicants: Dow Global Technologies LLC, Midland, MI (US); Dow Silicones Corporation, Midland, MI (US)

(72) Inventors: Xiaolian Hu, Shanghai (CN); Jiguang Zhang, Shanghai (CN); Yan Zheng, Shanghai (CN); Hongyu Chen, Shanghai (CN); Chen Chen, Shanghai (CN); Dorab Bhagwagar, Saginaw, MI (US); Darren Hansen, Auburn, MI (US)

(73) Assignees: DOW SILICONES CORPORATION, Midland, MI (US); DOW GLOBAL TECHNOLOGIES LLC (DGTL), Midland, MI (US)

( * ) Notice: Subject to any disclaimer, the term of this patent is extended or adjusted under 35 U.S.C. 154(b) by 434 days.

(21) Appl. No.: 17/268,143

(22) PCT Filed: Nov. 7, 2018

(86) PCT No.: PCT/CN2018/114267
§ 371 (c)(1),
(2) Date: Feb. 12, 2021

(87) PCT Pub. No.: WO2020/093258
PCT Pub. Date: May 14, 2020

(65) Prior Publication Data
US 2021/0332280 A1  Oct. 28, 2021

(51) Int. Cl.
| | |
|---|---|
| *C09K 5/14* | (2006.01) |
| *C08G 77/20* | (2006.01) |
| *C08K 3/22* | (2006.01) |
| *C08K 3/28* | (2006.01) |
| *C08K 3/38* | (2006.01) |
| *C08K 5/3417* | (2006.01) |
| *C08K 7/18* | (2006.01) |
| *C08K 13/04* | (2006.01) |
| *F28F 23/00* | (2006.01) |
| *C08G 77/00* | (2006.01) |
| *H01L 23/373* | (2006.01) |
| *H01L 23/42* | (2006.01) |

(52) U.S. Cl.
CPC ............... *C09K 5/14* (2013.01); *C08G 77/20* (2013.01); *C08K 3/22* (2013.01); *C08K 3/28* (2013.01); *C08K 3/38* (2013.01); *C08K 5/3417* (2013.01); *C08K 7/18* (2013.01); *C08K 13/04* (2013.01); *F28F 23/00* (2013.01); *C08G 77/80* (2013.01); *C08K 2003/2227* (2013.01); *C08K 2003/2296* (2013.01); *C08K 2003/282* (2013.01); *C08K 2003/385* (2013.01); *C08K 2201/001* (2013.01); *C08K 2201/005* (2013.01); *C08K 2201/014* (2013.01); *H01L 23/3737* (2013.01); *H01L 23/42* (2013.01)

(58) Field of Classification Search
CPC .......... C09K 5/14; C08G 77/20; C08G 77/80; C08G 77/18; C08G 77/12; C08K 3/22; C08K 3/28; C08K 3/38; C08K 5/3417; C08K 7/18; C08K 13/04; C08K 2003/2227; C08K 2003/2296; C08K 2003/282; C08K 2003/385; C08K 2201/001; C08K 2201/005; C08K 2201/014; C08K 2003/382; C08K 9/06; F28F 23/00; H01L 23/3737; H01L 23/42
See application file for complete search history.

(56) References Cited

U.S. PATENT DOCUMENTS

| | | | |
|---|---|---|---|
| 3,445,420 A | 5/1969 | Kookootsedes et al. | |
| 3,989,667 A | 11/1976 | Lee et al. | |
| 4,370,358 A | 1/1983 | Hayes et al. | |
| 4,584,361 A | 4/1986 | Janik et al. | |
| 4,707,531 A | 11/1987 | Shirahata | |
| 4,962,174 A | 10/1990 | Bilgrien et al. | |
| 5,036,117 A | 7/1991 | Chung et al. | |
| 5,310,843 A | 5/1994 | Morita | |
| 6,114,429 A | 9/2000 | Yamada et al. | |
| 6,169,142 B1 | 1/2001 | Nakano et al. | |
| 6,255,257 B1 | 7/2001 | Yamada et al. | |
| 6,844,393 B2 | 1/2005 | Goto et al. | |
| 7,329,706 B2 | 2/2008 | Fukui et al. | |

(Continued)

FOREIGN PATENT DOCUMENTS

| | | | | | |
|---|---|---|---|---|---|
| CA | 2007549 C | * | 6/2000 | ........... | C07D 209/48 |
| DE | 102015225906 A1 | * | 6/2017 | ............. | C08G 77/08 |

(Continued)

OTHER PUBLICATIONS

Notice of Office Action from corresponding Chinese Application No. 201880098465.1 dated Jul. 19, 2022.

*Primary Examiner* — Nelson J Nieves

(74) *Attorney, Agent, or Firm* — Steven Mork

(57) ABSTRACT

A highly thermally conductive composition is provided, such composition comprising: (A) An organopolysiloxane composition; (B) a filler treating agent; (C) a thermal stabilizer; and (D) thermally conductive filler mixture, comprising: (D-1) a small-particulate thermally conductive filler having a mean size of up to 3 μm, (D-2) spherical aluminum nitride having a mean size of from 50 to 150 μm, (D-3) boron nitride having a mean size of from 20 to 200 μm.

13 Claims, No Drawings

(56) References Cited

U.S. PATENT DOCUMENTS

| | | |
|---|---|---|
| 10,647,830 B2 | 5/2020 | Ito |
| 11,248,154 B2 | 2/2022 | Ishihara et al. |
| 2007/0185287 A1* | 8/2007 | Itagaki ................ G03F 7/32 |
| | | 525/524 |
| 2007/0290202 A1 | 12/2007 | Matsumoto et al. |
| 2008/0139725 A1 | 6/2008 | Takemura et al. |
| 2018/0134938 A1 | 5/2018 | Hirakawa et al. |
| 2019/0092993 A1* | 3/2019 | Naik ..................... C09K 5/10 |
| 2019/0256756 A1 | 8/2019 | Ishihara et al. |
| 2021/0332280 A1* | 10/2021 | Hu ..................... C08G 77/12 |
| 2021/0403716 A1* | 12/2021 | Hu ..................... C08K 9/06 |

FOREIGN PATENT DOCUMENTS

| | | | |
|---|---|---|---|
| JP | 3142800 | 3/2001 | |
| JP | 4689824 B2 * | 5/2011 | ............ C09B 47/26 |
| JP | 2012041422 A * | 3/2012 | |
| JP | 2013520530 A * | 6/2013 | |
| KR | 101864505 | 6/2018 | |
| WO | WO-2013070350 A1 * | 5/2013 | ............ C08G 77/38 |
| WO | WO-2017099245 A1 * | 6/2017 | ............ C09D 5/00 |
| WO | WO-2017102502 A1 * | 6/2017 | ............ C08G 77/08 |
| WO | WO-2022190293 A1 * | 9/2022 | |

* cited by examiner

THERMALLY CONDUCTIVE COMPOSITION AND METHODS AND DEVICES IN WHICH SAID COMPOSITION IS USED

FIELD OF THE INVENTION

A highly thermally conductive silicone composition, methods for preparation and use of the same, and devices containing the same are disclosed. The silicone composition may be used as a thermal interface material and as part of heat dissipating materials in electronic devices.

BACKGROUND

As the telecommunications industry is going through a generational shift to 5G networks, highly integrated electrical devices with smaller size will bring doubled power consumption (power unit from 600 W to 1200 W), with higher heat generation that would impair performance if unattended. Thus, a higher-efficiency thermal management system is urgently demanded.

Various heat conductive materials are known. WO2016190189A describes a composition containing spherical heat-conductive fillers comprising aluminum (Al) or boron nitride (BN), but not both. U.S. Pat. No. 6,255,257B1 describes a composition containing aluminum nitride (AlN) power of two different size distributions up to 20 µm as thermally conductive fillers, optionally adding zinc oxide (ZnO), alumina, BN, and/or silicon carbide (SiC) powder fillers. KR10-1864505B1 describes a composition containing ZnO, aluminum oxide ($Al_2O_3$), and AlN of up to 5 µm as thermally conductive fillers. WO2018074247A1 describes a composition containing AlN of two different size distributions, up to 5 µm and more than 50 µm. WO2017203924A1 describes a composition that contains AlN and crushed alumina as thermally conductive fillers. EP896031B1 describes a composition containing fillers selected from powders of AlO, alumina, AlN, BN and SiC of various size distributions. JP3142800B2 describes a composition containing fillers comprising AlN and ZnO powder. However, none of the prior art has so far achieved the thermal conductivity level that the industry demands now.

SUMMARY OF THE INVENTION

A silicone composition with thermal conductivity of greater than 8 W/mK is provided, wherein the thermally conductive composition comprises organopolysiloxanes and combination of at least three kinds of thermally conductive fillers. The present invention also is a method comprising interposing the inventive thermally conductive composition along a thermal path between a heat source and a heat dissipater. Such heat source may comprise an (opto)electronic component, central processing units, current converters, batteries such as lithium ion batteries, and any other parts and units that produce heat upon operation mainly powered by or involving electricity. Another aspect of the present invention is a device comprising: a) a heat source, b) the inventive thermally conductive composition, and c) a heat dissipater, where the composition is positioned between the heat source and the heat dissipater along a thermal path extending from a surface of the heat source to a surface of the heat dissipater. Such heat source may comprise an electronic component. The device includes telecommunication and computing equipment such as servers, personal computers, tablets and handheld devices, electronic modules, in particular power electronics modules, electronic control units in automobiles, and electric vehicle battery packs.

DETAILED DESCRIPTION OF THE INVENTION

All amounts, ratios, and percentages are by weight unless otherwise indicated. The following terms are used herein with the intention to give them the meanings as described below.

The articles "a", "an", and "the" each refer to one or more. "Combination" means two or more items put together by any method. "cSt" means centiStokes. "DP" means degree of polymerization, i.e. the number of monomers found in a polymer molecule. For linear polysiloxane, DP is determined by 29Si-NMR, from the ratio of the number of terminal siloxy unit ($R^3SiO$—) and the number of the chain-forming divalent siloxy unit (—$R^2SiO$—). In resins, the DP is accurately calculated from the structure of the starting materials. For other polysiloxanes, DP is calculated from the molecular size of the polymer determined by gel permeation chromatography using polystyrene as the standard samples and the known side chains; a siloxy unit with methyl groups attached is approximately 100 g/mole. "May" indicates a choice. "mPa·s" means millipascal second. "Surface-treated" means that all, or a portion of, reactive groups on a particle have been rendered unreactive by any convenient chemical or unreactive means. The abbreviation "W" means Watts, "W/mK" means Watts per meter Kelvin, and "µm" means micrometers. As used herein, "alkyl" group means aliphatically saturated group, that, unless otherwise specified, consist of carbon and hydrogen, non-limiting examples of which are methyl, ethyl, propyl, butyl, pentyl, hexyl, octyl, decyl, undecyl, dodecyl, octadecyl, and eicosyl, and their isomers when there are more than 3 carbon atoms. "Cycloalkyl" means alkyl where some or all carbon atoms participate in forming a circular structure with no aliphatic unsaturation within the circle, exemplified by cyclopentyl and cyclohexyl. As used herein, "alkenyl" group means a group having an aliphatically unsaturated bond and consisting of carbon and hydrogen, non-limiting examples of which are vinyl, allyl, butenyl, pentenyl, hexenyl, heptenyl, decenyl, undecenyl, dodecenyl, tridecenyl, tetradecenyl, pentadecenyl, hexadecenyl, heptadecenyl octadecenyl, nonadecenyl, eicosenyl and their isomers where there are more than 3 carbon atoms. As used herein, "aryl" group means group derived from monocylic and polycyclic aromatic hydrocarbons, by removal of a hydrogen atom from a ring carbon atom, the non-limiting examples of which are phenyl, tolyl, xylyl, naphthyl, benzyl, and phenylethyl. The term "ppm" refers to weight parts per million.

Unless otherwise indicated, viscosity was measured at 25° C. by a method based on ASTM D-445, IP 71, using a viscosity glass capillary (CTM0004 A), where the kinematic viscosity of liquids was determined by measuring the time required for a fixed volume of sample to pass through a calibrated glass capillary using gravity flow.

Thermally Conductive Composition.

The thermally conductive composition of the present invention comprises: (A) An organopolysiloxane composition; (B) a filler treating agent; (C) a thermal stabilizer; and (D) thermally conductive filler, which is a mixture of at least three different kinds of fillers: (D-1) a small-particulate thermally conductive filler having a mean size of up to 3 µm; (D-2) spherical aluminum nitride having a mean size of from 50 to 150 µm; and (D-3) boron nitride having a mean size of from 20 to 200 µm, and may further comprise other thermally conductive particles.

(A) Base polymer. Component (A) of the thermally conductive composition may be a non-curable or curable organopolysiloxane composition. An example of non-curable component (A) comprises an organopolysiloxane having a general formula (I)

$$R^1_3SiO—(R^1R^2SiO)_a(R^1_2SiO)_b—R^3—SiR^1_3 \quad (I)$$

wherein each $R^1$ is independently a monovalent organic group free of aliphatic unsaturation, i.e., a straight or branched alkyl group, preferably consisting of 1, 2, 3, or up to 6 carbon atoms. $R^1$ may be a methyl group. Each $R^2$ is an aryl group. $R^2$ may be a phenyl group. Each $R^3$ is selected from an oxygen atom or a divalent hydrocarbon group. Whether $R^3$ is an oxygen atom or a divalent hydrocarbon group depends on the method used to prepare the organopolysiloxane of formula (I). The divalent hydrocarbon group may consist of 1 or more, 2 or more, 3 or more, 4 or more, 5 or more, and at the same time generally consists of up to 6, up to 10, or up to 12 carbon atoms. Preferably, $R^3$ is an oxygen atom. Subscript "a" may be 0, or has an average value of at least 1, and subscript "b" has an average value of at least 1. Subscript "a" and subscript "b" may have average values such that the sum (a+b) is sufficient to provide the organopolysiloxane of formula (I) with a viscosity ranging from 10 or more, 20 or more, 40 or more, and at the same time 100 or less, 200 or less, 300 or less, or up to 400 mPa·s, but the range of from 20 to 400 mPa·s is desirable for good processability. An exemplary viscosity is 100 mPa·s. The sum (a+b) is a positive number in a range of 20 or more, 50 or more, and 80 or more, and at the same time up to 100, 120, 150, or 200. The sum (a+b) may preferably be in the range from 20 to 150. The molar ratio of a/b may range up to 4.2, from 0, from 0.2, or alternatively from 0.38.

The organopolysiloxane of formula (I) may be trimethylsiloxy-end-capped poly(dimethylsiloxane/ methylphenylsiloxane) copolymer, available as DOWSIL™ 510 Fluid or 550 Fluid from Dow Silicones Corporation of Midland, Michigan, USA.

When subscript "a" is zero, the organopolysiloxane of formula (I) may be trimethylsiloxy-terminated polydimethylsiloxane, commercially available from various sources.

The organopolysiloxanes of formula (I) may be prepared by well-known methods fully described in literature, such as hydrolysis and condensation of the corresponding organohalosilanes or equilibration of cyclic diorganopolysiloxanes. For example, organopolysiloxanes may be prepared by ring opening polymerization of cyclic diorganopolysiloxanes using a lithium catalyst to yield organopolysiloxanes having silicon-bonded hydroxyl groups. Thereafter, the organopolysiloxanes having silicon-bonded hydroxyl groups may be reacted with alkoxysilanes to prepare component (A). Alternatively, organopolysiloxanes suitable for use as component (A) may be prepared by methods such as those disclosed, for example, in U.S. Pat. No. 4,962,174.

The organopolysiloxane of component (A) may also be branched, having small amounts of monoalkylsiloxane units ($R^1SiO_{3/2}$) at the branching points, so long as component (A) has a viscosity ranging from 10 to 400 mPa·s, or more specifically, from 10 or more, 20 or more, 40 or more, and at the same time 100 or less, 200 or less, 300 or less, or up to 400 mPa·s.

Component (A) can be one single base polymer or a combination comprising two or more base polymers that differ in at least one of the following properties: structure, viscosity, average molecular weight, siloxane units, and sequence.

Another example of component (A) is a curable mixture comprising component (A'1), an organopolysiloxane with at least two silicon-bonded alkenyl group, and component (A'2), one or more silanes or organopolysiloxanes that have in one molecule on average at least two silicon-bonded hydrogen atom, which participate in a hydrosilylation reaction with alkenyl groups of component (A'1) and, as a result, are capable of cross-linking and curing component (A).

The polymer that constitutes component (A'1) may have a linear molecular structure or, to some extent, branched linear, or dendrite molecular structure. It may be in the form of a single polymer, copolymer, or a mixture of two or more polymers. The average size of polymers of component (A'1) may have DP of more than 10, more than 20, more than 30, more than 40, more than 50, more than 75, or more than 100, and at the same time smaller than 200, smaller than or 150, or smaller than 120 Preferably DP of component (A'1) is 50. The viscosity may be in the range of from 10 to 400 mPa·s, and more specifically from 10 or more, 20 or more, 40 or more, and at the same time 80 or less, 100 or less, 200 or less, 300 or less, or up to 400 mPa·s. Preferably, the viscosity may be in the range of from 20 to 400 mPa·s. The silicon-bonded alkenyl group of component (A'1) is preferably vinyl, allyl, or hexenyl group. More than one kind of alkenyl groups may be found in one molecule. These alkenyl groups in component (A'1) may be located at terminal, pendant, or both terminal and pendant positions.

The remaining silicon-bonded organic groups in component (A'1) may be alkyl groups, having 1, 2, 3, 4, 5, or 6 carbon atoms; cycloalkyl groups; and aryl groups; and 3,3,3,-trifluoropropyl, or similar halogenated alkyl groups. Preferably, the organic groups are methyl or phenyl groups. The remaining silicon-bonded organic groups are preferably methyl groups.

The terminal groups may be alkyl or aryl groups as described in the preceding paragraph, alkoxy groups exemplified by methoxy, ethoxy, or propoxy groups, or hydroxyl groups.

Certain exemplary molecules of component (A'1) may be described by the following formulae (II) and/or (III):

$$R^1_{(3-p)}R^4_pSiO(R^1_2SiO)_c(R^1R^2SiO)_d(R^1R^4SiO)_e SiR^1_{(3-q)}R^4_q, \quad (II)$$

$$R^1_3SiO(R^1_2SiO)_f(R^1R^2SiO)_g(R^1R^4SiO)_hSiR^1_3, \quad (III)$$

or a combination thereof.

In formulae (II) and (III), each $R^1$ is as described above, i.e., independently a monovalent organic group free of aliphatic unsaturation, such as a straight or branched alkyl group. $R^1$ may be a methyl group. Each $R^2$ is as described above, i.e. an aryl group. $R^2$ may be a phenyl group. Each $R^4$ is independently an alkenyl group. Subscripts p and q are independently 0, 1, or 2, provided that p, q, and e are not all 0 at the same time. Subscript c has an average value of at least 0.1, and typically at least 2, more typically at least 20, and at the same time is generally up to 100, or up to 150. Subscript d and subscript e may be 0. Alternatively, subscript e may have an average value ranging from more than 0 to 150. The sum (c+d+e) is at least 0.1, at least 2, or typically at least 20, and at the same time up to 100, 150, or 200. Subscript f has an average value of at least 0.1, at least 2, or typically at least 20 and at the same time is generally up to 100, or up to 150 or less. Subscript g may be 0.

Subscript h is a positive number. The sum (f+g+h) is at least 0.1, at least 2, typically at least 20, and at the same time up to 100, 150, or 200.

Exemplary molecules useful as component (A'1) are linear organopolysiloxane where both molecular terminals are capped with certain groups, as described below: dimethylvinylsiloxy-terminated dimethylpolysiloxane; methylphenylvinylsiloxy-terminated dimethylpolysiloxane; dimethylvinylsiloxy-terminated methylphenylsiloxane-dimethylsiloxane copolymer; trimethylsiloxy-terminated methylvinylsiloxane-dimethylsiloxane copolymer; dimethylvinylsiloxy-terminated methylvinylsiloxane-dimethylsiloxane copolymer; dimethylvinylsiloxy-terminated methyl (3,3,3-trifluoropropyl) polysiloxane; dimethylvinylsiloxy-terminated methyl (3,3,3-trifluoropropyl) siloxane-dimethylsiloxane copolymer; silanol-terminated methylvinylsiloxane-dimethylsiloxane copolymer; silanol-terminated copolymer of methylvinylsiloxane, methylphenylsiloxane, and dimethylsiloxane; or an organosiloxane copolymer composed of siloxane units represented by the following formulae: $(CH_3)_3SiO_{2/2}$, $(CH_3)_2(CH_2=CH)SiO_{2/2}$, $CH_3SiO_{3/2}$, and $(CH_3)_2SiO_{2/2}$. The organopolysiloxane of component (A'1) may also have small amounts of monoalkylsiloxane units ($R^1SiO_{3/2}$), so long as component (A) has a viscosity less than 10,000 mPa·s.

Component (A'2) comprises a silane or an organohydrogenpolysiloxane that has in one molecule on average at least 2 silicon-bonded hydrogen atoms ("SiH"), which is capable of participating in a hydrosilylation reaction with the aliphatically unsaturated organic groups of component (A'1) and, as a result, makes component (A) cross-linkable and curable. Component (A'2) may have a linear, branched, partially branched linear, cyclic, dendrite, or resinous molecular structure. The silicon-bonded hydrogen atoms in component (A'2) may be located at terminal, pendant, or at both terminal and pendant positions. Component (A'2) may be a combination of two or more organohydrogenpolysiloxanes that differ in at least one of the following properties: structure, average molecular weight, viscosity, siloxane units, and sequence.

The amount of component (A'2) relative to component (A'1) should be such that it is sufficient to provide a molar ratio of SiH groups in component (A'2) to aliphatically unsaturated organic groups in component (A'1) (commonly referred to as the SiH:Vi ratio) ranging from 10:1 to 0.1:1. In certain embodiments, the SiH:Vi ratio is within the range of 2:1 to 0.1:1, and preferably from 1.5:1 to 0.2:1, and more preferably from 0.5:1 to 0.6:1.

Silicon-bonded groups of component (A'2) other than silicon-bonded hydrogen atoms may be alkyl groups; cycloalkyl groups; aryl groups; benzyl, phenethyl, or similar aralkyl groups; or 3,3,3- trifluoropropyl, 3-chloropropyl, or similar halogenated alkyl group. Preferable are alkyl and aryl groups, in particular, methyl and phenyl groups.

Component (A'2) may comprise a compound of the formulae (IV) and/or (V)

$$R_3SiO(R_2SiO)_i(RHSiO)_jSiR_3,\quad\quad\quad (IV)$$

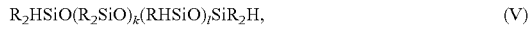

$$R_2HSiO(R_2SiO)_k(RHSiO)_lSiR_2H,\quad\quad\quad (V)$$

or a combination thereof.

In formulae (IV) and (V) above, subscript i may be 0, or has an average value that is a positive number up to 150, subscript j has an average value ranging from 2 to 30, subscript k may be 0, or has an average value that is a positive number up to 150, and subscript l may be 0, or has an average value that is a positive number up to 150. Preferably, the sum (i+j) and the sum (k+l) are each independently 2 or more, 3 or more, 12 or more, 20 or more, 27 or more, 35 or more, 50 or more, 75 or more, 100 or more, and at the same time generally up to 100, up to 120, or up to 150. Each R is independently a monovalent organic group with a saturated or unsaturated aliphatic bond, including alkyl; cycloalkyl; alkenyl; alkynyl such as ethynyl, propynyl, and butynyl; and aryl.

Exemplary molecules useful as component (A'2) are linear alkylhydrogenpolysiloxane where both molecular terminals are capped with certain groups, as described below: trimethylsiloxy-terminated methylhydrogenpolysiloxane; trimethylsiloxy-terminated methylhydrogensiloxane-dimethylsiloxane copolymer; dimethylhydrogensiloxy-terminated dimethylpolysiloxane; dimethylhydrogensiloxy-terminated methylhydrogenpolysiloxane; dimethylhydrogensiloxy-terminated methylhydrogensiloxane-dimethylsiloxane copolymer; cyclic methylhydrogenpolysiloxane; organosiloxane composed of siloxane units represented by the following formulae: $(CH_3)_3SiO_{1/2}$, $(CH_3)_2HSiO_{1/2}$, and $SiO_{4/2}$. Dimethylhydrogensiloxy-terminated polydimethylsiloxanes having relatively low degrees of polymerization (DP), for example ranging from 3 to 50, are commonly referred to as chain extenders, and a portion of component (A' 2) may be a chain extender.

Component (A'2) may be or include a silane. Examples of silanes are tetra(dimethylhydrogensiloxy) silane and methyl-tri(dimethylhydrogensiloxy) silane.

Methods of preparing linear, branched, and cyclic organohydrogenpolysiloxanes suitable for use as component (A'2), such as hydrolysis and condensation of organohalosilanes, are well known in the art. Methods of preparing organohydrogenpolysiloxane resins suitable for use as component (A'2) are also well known as exemplified in U.S. Pat. Nos. 5,310,843; 4,370,358; and 4,707,531.

The total amount of component (A) depends on various factors including the organopolysiloxanes selected for component (A) and the thermally conductive filler selected for component (B). However, the total amount of component (A) (i.e., all the organopolysiloxanes combined) may range from 2 vol % to 35 vol %, alternatively 10 vol % to 15 vol %, and alternatively 10 vol % to 35 vol % of total volume of all components in the thermally conductive composition.

Curable component (A) may remain uncured, cure during the preparation of the thermally conductive silicone composition, cure after the thermally conductive silicone composition is placed proximally to a heat bearing item from which heat is conducted through the thermally conductive silicone composition, or be cured by hydrosilylation prior to the addition to the thermally conductive silicone composition. Component (A) may be cured partially or fully to give a cured composition having a viscosity/hardness of Shore 00 (5 to 85), and may have soft putty texture, the hardness of which cannot be measured.

(B) Filler treating agent. Component (B) of the thermally conductive composition comprises a reactive silane and/or a reactive silicone for surface-treatment of fillers. Treating agents and treating methods are known in the art, see for example, U.S. Pat. No. 6,169,142 (col. 4, line 42 to col. 5, line 2).

The amount of component (B) may vary depending on various factors including the type and amounts of fillers selected for component (D) and whether the filler is treated with component (B) in situ or before being combined with other components of the thermally conductive composition.

Regardless, the thermally conductive composition may comprise an amount ranging from 0.1% to 2%, and any value in between, of component (B).

Component (B) may comprise an alkoxysilane having the formula:

$$R^5_r Si(OR^6)_{(4-r)}, \quad (VI)$$

where subscript r is 1, 2, or 3; preferably r is 3.

Each $R^5$ is independently a monovalent organic group, such as a monovalent hydrocarbon group of 1 or more, preferably 6 or more and at the same time 50 or fewer, preferably 18 or fewer carbon atoms. $R^5$ can be saturated or unsaturated, branched or unbranched, and unsubstituted. $R^5$ is exemplified by alkyl groups and aryl groups, and in particular methyl, ethyl, hexyl, octyl, decyl, dodecyl, octadecyl, phenyl or phenylethyl group, in combination with any of the $R^6$ described below. Preferably, $R^5$ is a decyl group.

Each $R^6$ may be an alkyl group of 1 to 4 carbon atoms, alternatively 1 to 2 carbon atoms. Alkoxysilanes for component (B) are exemplified by hexyltrimethoxysilane, octyltriethoxysilane, decyltrimethoxysilane, dodecyltrimethoxysilane, tetradecyltrimethoxysilane, phenyltrimethoxysilane, phenylethyltrimethoxysilane, octadecyltrimethoxysilane, octadecyl-triethoxysilane, and a combination thereof. Component (B) may be n-decyltrimethoxysilane.

Component (B) may also be alkoxy-functional oligosiloxanes. Alkoxy-functional oligosiloxanes and methods for their preparation are known in the art, see for example, EP1403326B1 and U.S. Pat. No. 6,844,393. Suitable alkoxy-functional oligosiloxanes include those of the formula

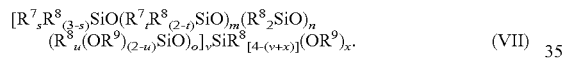
$$[R^7_s R^8_{(3-s)} SiO(R^7_t R^8_{(2-t)} SiO)_m (R^8_2 SiO)_n (R^8_u (OR^9)_{(2-u)} SiO)_o]_v SiR^8_{[4-(v+x)]} (OR^9)_x. \quad (VII)$$

In this formula, each $R^7$ may be independently selected from alkenyl groups, including alkenyl groups attached to cyclic alkyl or aryl groups (e.g. vinylcyclohexyl, vinylphenyl, vinylbenzyl, vinylphenetyl), having 2 or more and at the same time 6 or fewer, 8 or fewer, 10 or fewer, 12 or fewer carbon atoms; $R^7$ preferably is vinyl, allyl, or hexenyl. Each $R^8$ may be independently selected from linear or branched alkyl, cycloalkyl, aryl, and aralkyl (i.e. aryl-substituted alkyl, e.g. benzyl or phenethyl) groups having at least 1 carbon atom and up to 20 carbon atoms; $R^8$ may be halogenated. Preferably, $R^8$ is methyl or ethyl. Each $R^9$ may be same or different from each other, and may be alkyl, alkoxyalkyl, alkenyl, or acyl, each preferably having 1, 2, 3, 4, 6, or up to 10 carbon atoms and may be straight chain, branched, or cyclic. Preferred alkyl is methyl, ethyl, or propyl; preferred alkoxyalkyl is methoxyethyl, ethoxyethyl, or methoxyprogyl; preferred alkenyl is vinyl, allyl, or isopropenyl; acyl may be acetyl. All subscripts are integers and each selected from the following range or choices; subscript s is 0 to 3; subscript t is 1 or 2; subscript u is 0, 1, or 2; and subscript v is 1, 2, or 3; subscript x is 0 to 3; provided that v and x are selected so that the sum (v+x) is 1 to 4. Subscripts m, n, and o are each independently an integer of 0 to 100, provided that when s is 0, m is 1 or more, when x is 0, u is 0 or 1 and at the same time o is 1 or more, and the sum (m+n+o) is 1 or more and no more than 200. Preferably, m, n, and o are each independently 1 or more, 5 or more, or 10 or more, and at the same time 10 or less, 25 or less, 50 or less, 75 or less, up to 100. Preferred oligosiloxane may be trialkoxysiloxy-terminated dimethylpolysiloxane such as $(MeO)_3Si(OSiMe_2)_{110}OSiMe_3$ and may also contain an alkenyl group at the terminal, exemplified by $(MeO)_3Si(OSiMe_2)_{25}OSiMe_2Vi$, wherein "Me" represents $CH_3$- (methyl) and "Vi" represents $-CH=CH_2$ (vinyl). Component (B) may be mono dimethylvinylsiloxy- and mono trimethoxysiloxy-terminated dimethyl siloxane.

Metal fillers can also be treated with alkylthiols such as octadecyl mercaptan and others, and fatty acids such as oleic acid, stearic acid, titanates, titanate coupling agents, zirconate coupling agents, and a combination thereof.

(C) Thermal Stabilizer. The thermally conductive composition comprises a (C) thermal stabilizer. Indanthrene blue, terphenyl, phthalocyanines or metal phthalocyanines are examples of thermal stabilizer that impart a resistance to degradation in the presence of heat and ionizing radiation to specified types of silicone elastomers. Polynuclear benzenoid compounds such as copper phthalocyanine and ingoid dyes are also known to improve the thermal stability of silicone elastomers cured using organic peroxides. In particular, phthalocyanine with or without a metal atom conjugated, is used in the thermally conductive composition.

Suitable phthalocyanine compounds are represented by formula (VIII) and metal chelated staes are represented by formula (IX).

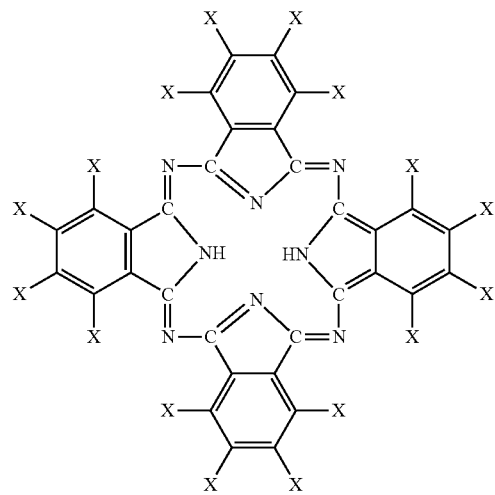

(VIII)

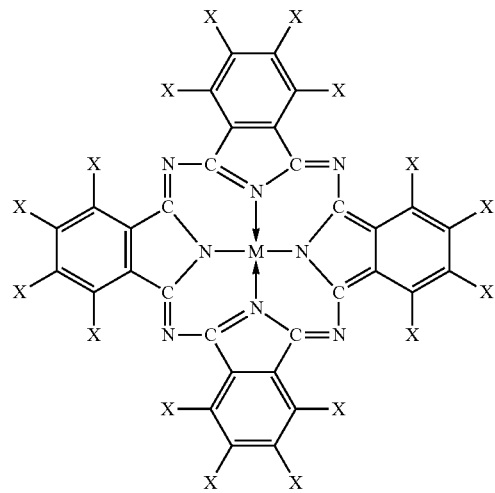

(IX)

X each independently represents a hydrogen or halogen atom. Suitable halogen atoms are chlorine, bromine, and iodine. In formula (IX), M is a metal atom selected from copper, nickel, cobalt, iron, chromium, zinc, platinum, and vanadium. When M is copper, all X are hydrogens. Preferably, the phthalocyanine compound is 29H, 31H-phthalocyanine, and a preferred metal-chelated phthalocyanine compound is 29H, 31H-phthalocyaninato (2-)-N29, N30, N31, N32 copper. Phthalocyanine compounds are available commercially, such as Stan-tone™ 40SP03 or 505P01 from PolyOne Corporation, Avon Lake, Ohio, USA.

Component (C) is added to the thermally conductive organopolysiloxane composition in an amount such that in terms of weight units the phthalocyanine compound is desirably % or more, 0.05% or more, even 0.07% or more while at the same time is desirably 5.0% or less, 0.2% or less or even 0.1% or less of the composition as a whole.

(D) Thermally conductive filler. The thermally conductive composition of the present invention is characterized by the three different groups of filler particles that work synergistically to provide a high thermal conductivity. Each of the three groups is defined by the size distribution and the type of material that the filler particles comprise. The particles may be spherical, nearly spherical, semi-spherical, or irregular in shape so long as the aspect ratio is no more than 3 as determined by electron micrograph. In some particles, the aspect ratio is in the range of 2:1 to 30:1.

Average particle size are determined by laser diffraction particle size analyzers (for example CILAS920 Particle Size Analyzer or Beckman Coulter LS 13 320 SW) according to the operation software. The average particle size may be estimated based on measuring the surface area according to 8-11 ASTM D4315 or by using sieves of various mesh sizes and calculating the average from the cumulative weight of each size fractions. These alternative methods give estimations of the average particle sizes similar to those determined by the laser diffraction method.

Group (D-1) comprises small-particulate thermally conductive filler having a mean size of up to 3 µm. The mean size may be as small as 0.1 µm. Particles in group (D-1) may comprise zinc oxide, aluminum oxide, or aluminum nitride.

Group (D-2) comprises particles having a mean size of from 50 to 150 µm. The mean size in µm may 50 or more, 70 or more, 100 or more, even 120 or more while at the same time can be 150 or less, 100 or less, 70 or less and even 50 or less. The preferred material is aluminum nitride. Fillers may be metallic fillers with surface layers of aluminum nitride.

Group (D-3) comprises particles having a mean size of from 20 to 200 µm. The mean in um may be 20 or more, 50 or more, 70 or more, 100 or more, 120 or more, or 150 or more, and the same time may be 150 or less, 100 or less, 70 or less, 50 or less or even 20 or less. The preferred material is boron nitride. Boron nitride is found as agglomerate and may be spherical or have irregular shape.

Each of the group (D-1), (D-2) and (D-3) may contain more than one uniform group of fillers. For example, each group may comprise particles having two or more peaks of size distribution. (D-1) may comprise particles with different compositions such as containing both zinc oxide and aluminum oxide.

Relative to the total weight of the thermally conductive composition, the preferred weight ratio of spherical aluminum nitride in a thermally conductive composition is in range of 40-60 wt %, and the preferred weight ratio of boron nitride in a silicone composition is in range of 1-10 wt %. The small particle fillers may be added so that the total amount of fillers in the thermally conductive composition would be from 50 wt % up to 97 wt %. The shape of the thermally conductive filler particles is not specifically restricted, however, rounded particles may prevent viscosity increase to an undesirable level upon high loading of the thermally conductive filler in the composition.

The thermally conductive composition may further comprise other thermally conductive particles. Such additional fillers may be selected from the group consisting of aluminum trihydrate, barium titanate, beryllium oxide, carbon fibers, diamond, graphite, magnesium hydroxide, magnesium oxide, metal particulate, onyx, silicon carbide, tungsten carbide, zinc oxide, and a combination thereof. Additional fillers may also be particles of metal. Suitable metallic fillers are exemplified by particles of metals selected from aluminum, copper, gold, nickel, silver, and combinations thereof, and alternatively aluminum. Suitable metallic fillers are further exemplified by particles of the metals listed above having layers on their surfaces selected from aluminum oxide, copper oxide, nickel oxide, silver oxide, and combinations thereof.

Additional fillers may comprise bismuth (Bi), gallium (Ga), indium (In), tin (Sn), or an alloy thereof, and as such, meltable. The alloys may comprise gold (Au), silver (Ag), cadmium (Cd), copper (Cu), lead (Pb), tin (Sn), or a combination thereof. Examples of alloys include Ga, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. The meltable filler may have a melting point ranging from 50° C. to 250° C., alternatively 150° C. to 225° C. The meltable filler may be a eutectic alloy, a non-eutectic alloy, or a pure metal.

These fillers are commercially available. For example, aluminum oxide of differing particle sizes are commercially available as Alunabeads™ from Showa Denko K.K., Japan, and as AA-04, AA-2, and AA18 from Sumitomo Chemical Co., Japan. Zinc oxides are commercially available from, e.g., American Zinc Recycling Corp., Pittsburgh, PA, U.S.A. (under trademark KADOX®) or from Zochem LLC, Dickson, TN, U.S.A. Metal fillers are available from, e.g., Indium Corp., Utica, NY, U.S.A.; Arconium Specialty Alloys Company, Providence, RI, U.S.A.; and AIM Metals & Alloys LP, Montreal, Canada. Aluminum fillers are commercially available, e.g., from Toyal America, Inc. of Naperville, IL, U.S.A. and Valimet Inc., of Stockton, Calif., U.S.A. Silver filler is commercially available from Metalor Technologies SA, Switzerland.

Additional Ingredients

When component (A) is a curable composition, the thermally conductive composition may further comprise (E) curing catalyst and/or (F) curing inhibitor. The thermally conductive composition may further comprise one or more additional ingredient selected from (G) a spacer, (H) a stabilizer, (I) a pigment, (J) a vehicle, (K) a wetting agent, and (L) a flame retardant.

(E) Curing catalyst. Component (E) is a catalyst that accelerates the hydrosilylation reaction. Suitable hydrosilylation catalysts are well-known in the art and commercially available. Component (E) may comprise a platinum group metal selected from platinum, rhodium, ruthenium, palladium, osmium or iridium metal or organometallic compound, complexes, or ligands thereof, or a combination thereof.

Component (E) is exemplified by a fine platinum metal powder, platinum black, platinum dichloride, platinum tetrachloride; chloroplatinic acid, alcohol-modified chloroplatinic acid, chloroplatinic acid hexahydrate; and complexes of said compounds, such as platinum complex of olefin, platinum complex of carbonyl, platinum complex of alkenylsiloxane, e.g. 1,3-divinyltetramethyldisiloxane, platinum complex of low molecular weight organopolysiloxanes, for example 1,3-diethenyl-1,1,3,3-tetramethyldisiloxane, a complex of chloroplatinic acid with β-diketone, a complex a chloroplatinic acid with olefin, and a complex of a chloroplatinic acid with 1,3-divinyltetramethyldisiloxane. These complexes may be microencapsulated in a resin matrix or core-shell type structure, or may be mixed and embedded in thermoplastic organic resin powder composed of methylmethacrylate, carbonate, polystyrene, silicone, or similar resins.

Component (E) is used in an amount such that in terms of weight units the content of platinum group metal is generally 0.01 ppm or more, 0.1 ppm or more, one ppm or more, 2 ppm or more, or even five ppm or more while at the same time is generally 1,000 ppm or less, 500 ppm or less, 200 ppm or less or even 150 ppm or less, relative to the total weight of components (A) and (B).

(F) Curing inhibitor. Component (F) is a hydrosilylation inhibitor to prevent premature curing of the curable composition and to adjust speed of curing, to improve handling of the composition under industrial conditions. Such inhibitors are, for example, alkyne alcohols such as an acetylenic alcohol, enyne compounds, benzotriazole, amines such as tetramethyl ethylenediamine, dialkyl fumarates, dialkenyl fumarates, dialkoxyalkyl fumarates, maleates such as diallyl maleate, and a combination thereof. Specific examples of such inhibitor compounds are: acetylene-type compounds, e.g., 2-methyl-3-butyn-2-ol, 3-methyl-1-butyn-3-ol, 3,5-dimethyl-1-hexyn-3-ol, 2-phenyl-3-butyn-2-ol, 3 -phenyl-1-butyn-3-ol, 1-ethynyl-1-cyclohexanol, 1,1-dimethyl-2- propynyl)oxy)trimethylsilane, methyl(tris(1,1-dimethyl-2-propynyloxy))silane; en-yne compounds, e.g., 3-methyl-3-penten-1-yne, 3,5-dimethyl-3-hexen-1-yne; triazols, e.g., benzotriazole; hydrazine-based compounds; phosphines-based compounds; mercaptane-based compounds; cycloalkenylsiloxanes e.g., methylvinylcyclosiloxanes, such as 1,3, 5,7-tetramethyl-1,3,5,7-tetravinyl cyclotetrasiloxane, 1,3,5, 7-tetramethyl-1,3,5,7-tetrahexenyl cyclotetrasiloxane. The amount of such inhibitors in the hydrosilylation-curable thermally conductive silicone composition may be within the range of 0.0001 to 5 wt % of component (A). Suitable hydrosilylation cure inhibitors are disclosed by, for example, U.S. Pat. Nos. 3,445,420; 3,989,667; 4,584,361; and 5,036, 117.

(G) Spacer. Component (G) is a spacer, particles that are not thermally conductive. Spacer may comprise organic particles, inorganic particles, or a combination thereof. Spacers may have a particle size ranging from at least 50 μm, at least 100 μm or at least 150 μm, and at the same time, up to 125 μm or up to 250 μm. Spacers may comprise monodisperse beads such as glass or polymer (e.g., polystyrene) beads. The amount of spacer depends on various factors including the distribution of particles, pressure to be applied during placement, and temperature during placement. Component (G) may be added to control bondline thickness of the cured product of the curable composition. The thermally conductive silicone composition may contain at least 0.05 wt %, alternatively at least 0.1 wt %, and at the same time up to 1 wt %, alternatively to 2 wt %, up to 5wt % or up to 15 wt % of spacer added.

(H) Antioxidant Stabilizer. Component (H) antioxidant stabilizer may be added to the thermally conductive silicone composition in an amount ranging from 0.001% to 1%. Suitable stabilizers may be antioxidants, which are known in the art and commercially available. Suitable antioxidants include phenolic antioxidants and combinations of phenolic antioxidants with stabilizers. Phenolic antioxidants include fully sterically hindered phenols and partially hindered phenols. Stabilizers include organophosphorous derivatives such as trivalent organophosphorous compound, phosphites, phosphonates, and a combination thereof; thiosynergists such as organosulfur compounds including sulfides, dialkyl-dithiocarbamate, dithiodipropionates, and a combination thereof; and sterically hindered amines such as tetramethyl-piperidine derivatives.

Commercially available stabilizers include vitamin E and IRGANOX® 1010, which comprises pentaerythritol tetrakis (3-(3,5-di-t-butyl-4-hydroxyphenyl)propionate), from BASF Corporation, Charlotte, North Carolina, USA.

(I) Pigment. Examples of suitable component (I), pigments, include carbon black, readily available commercially. The amount of pigment depends on various factors including the pigment selected and tint of the color desired, however, when present the amount of pigment may range from 0.0001% to 1% based on the combined weights of all ingredients in the thermally conductive silicone composition.

(J) Vehicle. Additional component (J) is a vehicle such as a solvent or diluent. Component (J) may be added during preparation of the thermally conductive silicone composition, for example, to aid mixing and delivery. All or a portion of component (J) may additionally be removed after the thermally conductive silicone composition is prepared. Component (J) may be an organic solvent. Alternatively, component (J) may be a polydialkylsiloxane fluid (e.g., polydimethylsiloxane) having a viscosity ranging from 0.5 cSt to 10 cSt, alternatively 1 cSt to 5 cSt. Suitable polydimethylsiloxane fluids for use as the vehicle are known in the art and are commercially available under the tradenames DOWSIL™ 200 Fluids and OS Fluids from Dow Silicones Corporation of Midland, Michigan, USA. The amount of vehicle depends on various factors including the type and amount of organopolysiloxanes for component (A) and the filler for component (D), however, the amount vehicle may range from 0.0001 wt % to 3 wt %, alternatively 0.0001 wt % to 1 wt %, based on the combined weights of all ingredients in the thermally conductive silicone composition.

(K) Wetting Agent. Additional component (K) is a wetting agent, or a surfactant. Suitable wetting agents include the anionic, cationic, and nonionic surfactants known in the art to act as wetting agents. Suitable surfactants include silicone polyethers, ethylene oxide polymers, propylene oxide polymers, copolymers of ethylene oxide and propylene oxide, other non-ionic surfactants, and combinations thereof. The composition may comprise up to 0.05% of the surfactant based on the weight of the composition. Anionic wetting agents are exemplified by TERGITOL™ No. 7, cationic wetting agents are exemplified by TRITON™ X-100, and nonionic wetting agents are exemplified by TERGITOL™ NR 27, all available from The Dow Chemical Company, Midland, Michigan Method of Making the Thermally Conductive Composition The thermally conductive composition described above may be made by mixing all ingredients at ambient or elevated temperature using any convenient mixing equipment, such as a centrifugal mixer (commercially available from Hauschild) or a Baker-Perkins mixer.

Uses for the Thermally Conductive Composition

The thermally conductive composition described above may be used as a thermal interface material (TIM). The thermally conductive silicone composition may be interposed along a thermal path between a heat source and a heat dissipator. The thermally conductive silicone composition can be interposed by applying to the heat source (e.g., (opto)electronic component) and the heat dissipator in any order or simultaneously. The thermally conductive silicone composition may be interposed by any convenient means, such as wet-dispensing, screen printing, stencil printing, or solvent casting the thermally conductive silicone composition.

A device according to this invention comprises a) a heat source, b) a thermally conductive silicone composition described above, and c) a heat dissipator, where the thermally conductive silicone composition is positioned between the heat source and the heat dissipator along a thermal path extending from a surface of the heat source to a surface of the heat dissipator.

In the methods and devices described herein, the heat source may comprise an (opto)electronic component such as a LED, a semiconductor, a transistor, an IC, or a discrete device. The heat dissipator may comprise a heat sink, a thermally conductive plate, a thermally conductive cover, a fan, a circulating coolant system, or a combination thereof.

The thermally conductive silicone composition may be used in direct contact with the heat source (TIM1). For example, the thermally conductive silicone composition may be applied to the (opto)electronic component and a heat spreader in any order or simultaneously. Alternatively, the thermally conductive silicone composition may be used in direct contact with a first heat dissipator and a second heat dissipator (TIM2). The thermally conductive silicone composition may be applied either to a first heat spreader (such as a metal cover) and thereafter a second heat spreader (such as a heat sink), or the thermally conductive silicone composition may be applied to a second heat spreader and thereafter to a first heat spreader. Examples These examples are intended to illustrate the invention to one skilled in the art and should not be interpreted as limiting the scope of the invention set forth in the claims.

Samples of thermally conductive silicone composition are prepared using the following ingredients. Components used are listed in the below Table 1. Component (A) is exemplified by (a-1). Component (A'1) is exemplified by (a'1-1). Component (A'2) is exemplified by (a'2-1) and (a'2-2). Component (B) is exemplified by (b-1), (b-2), and (b-3). Component (C) is exemplified by (c-1). Component (D-1) is exemplified by (d1-1) and (d1-2). Component (D-2) is exemplified by (d2-1) and (d2-2). Component (D-3) is exemplified by (d3-1) and (d3-2). Component (E) is exemplified by (e-1). Component (F) is exemplified by (f-1).

TABLE 1

| | Component |
|---|---|
| a-1 | Trimethylsiloxy-terminated poly(dimethylsiloxane/methylphenylsiloxane)copolymer, 100 cSt viscosity |
| a'1-1 | Dimethylvinylsiloxy-terminated Dimethyl Siloxane, viscosity 70 cP, vinyl content 1.5% |
| a'2-1 | Trimethylsiloxy-terminated dimethyl siloxane-methylhydrogen siloxane copolymer, H content 0.36% (DP = 12) |

TABLE 1-continued

| | Component |
|---|---|
| a'2-2 | Trimethylsiloxy-terminated dimethyl siloxane-methylhydrogen siloxane copolymer, H content 0.10% (DP = 27) |
| b-1 | 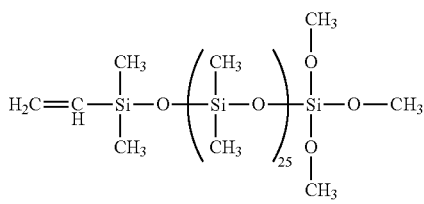 Dimethyl siloxane, Mono-trimethoxysiloxy- and Mono-dimethylvinylsiloxy-terminated, viscosity, (DP = 25) |
| b-2 | Dimethyl siloxane, Mono-trimethoxysiloxy- and Trimethylsiloxy-terminated, viscosity 130 cP (DP = 110) |
| b-3 | n-Decyltrimethoxysilane |
| c-1 | 29H,31H-phthalocyaninato(2-)-N29,N30,N31,N32 Copper |
| d1-1 | 2 μm spherical aluminum oxide ($Al_2O_3$) |
| d1-2 | 0.2 μm zinc oxide (ZnO) |
| d2-1 | 70 μm spherical aluminum oxide ($Al_2O_3$) |
| d2-2 | 80 μm spherical aluminum nitride (s-AlN) |
| d3-1 | 100 μm high density agglomerate boron nitride (BN) |
| d3-2 | 120 μm spherical agglomerate boron nitride (BN) |
| e-1 | 1,3-Diethenyl-1,1,3,3-Tetramethyldisiloxane Complexes (Plantinum) in a polysiloxane diluent, Pt content 1600 ppm |
| f-1 | Methyl(tris(1,1-dimethyl-2-propynyloxy))silane |

The particle size for (d1-1) was determined by Beckman Coulter counter, and also by electron micrograph. The particle size for (d1-2) was determined based on the surface area ($m^2/g$) provided by the vendor, using 8-11 ASTM D4315 method. The particle size for (d2-1) was determined using CILAS920 particle size analyzer. The particle size for (d2-2) was determined using the Beckman Coulter counter. 80 μm was the mode, with the numerical mean being 70 ηm. The particle size for (d3-1) and (d3-2) were determined using sieves having +80 to -270 US mesh. 100nm and 120nm were both mode and mean for (d3-1) and (d3-2), respectively.

Silicone composition preparation—The amount of components are listed in Table 2. Components to prepare the inventive silicone composition was mixed in SpeedMixer™ DAC 400.1 FVZ from Flack Tek Inc. Thermal stabilizer (c-1)(copper phthalocyanine: CuPc), silicone matrix components including silicone oil for nonreactive matrix (a-1) or vinyl polymer (a'-1), cross-linker (a'2), and inhibitor (f) for a curable silicone composition, and appropriate surface treating agent (b-1, b-2, or b-3)) were weighed into a cup of the SpeedMixer. Then small size filler (0.2 μm) (d1-2) and middle size filler (2 μm) (d1-1) were weighed and added into the cup. This mixture was mixed by the SpeedMixer (1500 rpm for 20 seconds, then 2000 rpm for 20 seconds). After mixing, half of large size fillers (>10 μm)(d2-1, d2-2) was weighed, added and then mixed by the SpeedMixer under the same mixing condition. If the resulting mixture paste was not uniform, the paste was scraped into the cup and mixed again under the same mixing condition. This was followed by the other half of the large size filler boron nitride (d3-1, d3-2) being added and mixed at 1500 rpm for 20 seconds, scraped and mixed again to form the samples. For the reactive composition, added platinum catalyst (e-1) and mixed further. Samples were placed at room temperature overnight before testing for compositions not designed for curing. For curable compositions, samples were formed into blocks of 29 mm×29 mm×8mm and heated at 150° C. for 15 minutes. At least two blocks were cured for every sample formulation.

Characterization—Thermal conductivity (TC) was measured by Hotdisk transient technology sensor C5501, heat time and power of 3-5 s/500 mW. Each fluid material was filled into two cups and a planar sensor was placed inside the cups. For the cured materials, a planar sensor was placed inside two cured blocks. Use fine-tuned analysis with temperature drift compensation and time correction selected between points 50-150.

Extrusion rate (ER) was measured by Nordson EFD dispensing equipment. Sample material was packaged into a 30cc syringe and dispensed at the pressure of 0.62 MPa. The weight of the sample dispensed at 1 min was used as the extrusion rate.

Table 2 lists the thermal conductive silicone composition formulations of inventive examples (Inv) and comparative examples (Comp) shown in volume ratios. The volume of component (A) and component (B), together representing fluid organopolysiloxane, and component (C) the heat stabilizer was fixed in all formulations with non-reactive silicone fluid. Component (D), filler, was added in amounts so that volume % and weight % are generally comparable to each other, except for Comp 5, which could not be loaded as much due to its viscosity. All examples contained 2 μm spherical $Al_2O_3$ (d1-1) and 0.2 μm zinc oxide (d1-2) as (D-1) filler. In Inv, 80 μm spherical aluminum nitride (d2-2) as filler (D-2) and 100 μm high density agglomerate boron nitride (d3-1) or 120 μm spherical agglomerate boron nitride (d3-2) as filler (D-3) were both present. In Comp, 70 μm spherical aluminum oxide (d2-1) instead of aluminum nitride, or only one of (D-2) or (D-3) was present. Comp-1 comprised aluminum oxide in addition to small fillers, but not aluminum nitride nor boron nitride. Comp-4 comprised aluminum nitride, but no boron nitride was present. In Comp-2 and Comp-3, aluminum oxide and boron nitride combination was used but no aluminum nitride. Single aluminum nitride was used in Comp-4; Single boron nitride was used Comp-5. In inventive example 3, platinum catalyst (e-1) and inhibitor (f-1) were present for controlled curing reaction.

TABLE 2

| Component | | Inv-1 | Inv-2 | Inv-3 | Comp-1 | Comp-2 | Comp-3 | Comp-4 | Comp-5 |
|---|---|---|---|---|---|---|---|---|---|
| (A) | a-1 | 2.78 | 2.78 | | 2.78 | 2.78 | 2.78 | 2.78 | 2.78 |
| (A'1) | a'-1 | | | 2.58 | | | | | |
| (A'2) | a'2-1 | | | 0.7 | | | | | |
| | a'2-2 | | | 0.046 | | | | | |
| (B) | b-1 | 1.7 | 1.7 | | 1.7 | 1.7 | 1.7 | 1.7 | 1.7 |
| | b-2 | | | 2.0 | | | | | |
| | b-3 | 0.14 | 0.14 | 0.3 | 0.14 | 0.14 | 0.14 | 0.14 | 0.14 |
| (C) | c-1 | 0.02 | 0.02 | 0.12 | 0.02 | 0.02 | 0.02 | 0.02 | 0.02 |
| (D-1) | d1-1 | 27.49 | 27.49 | 29.3 | 27.49 | 27.49 | 27.49 | 27.49 | 27.49 |
| | d1-2 | 12.9 | 12.9 | 13.9 | 12.9 | 12.9 | 12.9 | 12.9 | 12.9 |
| (D-2) | d2-1 | | | | 57 | 55 | 55 | | |
| | d2-2 | 46.5 | 46.5 | 49.1 | | | | 48.2 | |
| (D-3) | d3-1 | 2 | | | | | 2 | | |
| | d3-2* | | 0.8 | 0.75 | | | | 0.8 | 2.5 |
| (E) | e-1 | | | 0.15 | | | | | |
| (F) | f-1 | | | 0.004 | | | | | |
| Total (D) | | 83.6 | 83.6 | 80.9 | 83.5 | 83.6 | 83.6 | 83.5 | 70.5 |
| total | | 95.0 | 95.0 | 94.1 | 95.4 | 95.4 | 95.4 | 95.0 | 90.6 |

*(unit in volume ratio) except for the amount of catalytic platinum in ppm

Table 3 shows the thermal performance of the samples, shown as the TC and ER data.

TABLE 3

| | Inv-1 | Inv-2 | Inv-3 | Comp-1 | Comp-2 | Comp-3 | Comp-4 | Comp-5 |
|---|---|---|---|---|---|---|---|---|
| TC (W/mK) | 8.6 | 9.4 | 8.593 | 6.5 | 7.3 | 7.2 | 7.8 | 5.7 |
| ER (g/min) | 34 | 38 | 72 | 92 | 30 | 46 | 102 | 9 |

Inventive examples showed higher thermal conductivity than the comparative examples by at least 10%. Spherical aluminum nitride (80 μm; Comp-4) alone provides better thermal conductivity compared to spherical aluminum oxide (70 μm; Comp-1) by about 20%. Although boron nitride material is known to provide high thermal conductivity, boron nitride filler is difficult to mix into a substrate in a large amount (Comp-5), for example more than 5 wt %, thus yielding a composition with lower thermal conductivity, as well as low extrusion rate.

By using aluminum nitride together with boron nitride, both of certain size, significantly higher thermal conductivity was obtained (Inv-1, Inv-2). Replacing aluminum nitride with aluminum oxide (Comp-1, Comp-4) reduces thermal conductivity that cannot be compensated by the addition of boron nitride (Comp-2, up to 30%; comp-3). AlN/BN combination showed significantly higher thermal conductivity (up to 30% increase) than s-$Al_2O_3$/BN system. The thermal conductivity of s-AlN/BN system can be up to 9.4 W/mK while maintaining similar extrusion rate to s-$Al_2O_3$/BN system. The combination of the fillers in the silicone composition provide a unique capability to be thermally conductive at more than 8 W/mK.

INDUSTRIAL APPLICABILITY

The thermally conductive composition described above is suitable for use as a thermal interface material in various electronic devices to transfer heat from a heat-generating or heat-bearing part to a heat sink or heat-dissipating part of a device. The thermally conductive composition provides a level of thermal conductivity previously not available for such use, improving the efficiency and effectiveness of heat transfer.

What is claimed is:

1. A composition comprising:
    (A) An organopolysiloxane composition that comprises; an organopolysiloxane having a general formula (I)

$R^1_3Si$—$(R^1R^2SiO)_a(R^1_2SiO)_b$—$R^3$—$SiR^1_3$      (I)

wherein each $R^1$ is independently a C1-C6 alkyl group, each $R^2$ is an aryl group, each $R^3$ is selected from an oxygen atom or a divalent hydrocarbon group, subscript a is 0 or has an average value of at least 1, subscript b has an average value of at least 1;
    (B) a filler treating agent;
    (C) a thermal stabilizer; and
    (D) thermally conductive filler, comprising:
        (D-1) a small-particulate thermally conductive filler having a mean size of up to 3 μm;
        (D-2) spherical aluminum nitride having a mean size of from 50 to 150 μm;
        (D-3) boron nitride having a mean size of from 20 to 200 μm.

2. The composition according to claim 1, wherein component (A) is curable.

3. The composition according to claim 2, wherein component (A) is a combination of organopolysiloxanes comprising:

(A'1) An alkenyl-containing organopolysiloxane having general formula $R^1_{(3-p)}R^4_pSiO(R^1_2SiO)_c(R^1R^2SiO)_d(R^1R^4SiO)_e$
    $SiR^1_{(3-q)}R^4_q$,      (II)

$R^1_3SiO(R^1_2SiO)_f(R^1R^2SiO)_g (R^1R^4SiO)_hSiR^1_3$,      (III)

or
        a combination thereof,
        where each $R^1$ is independently an alkyl group, $R^2$ is independently an aryl group, $R^4$ is independently an alkenyl group, subscript d and subscript e may be 0 or a positive number, subscripts p and q are independently 0, 1, or 2, provided that p, q, and e are not all 0 at the same time,; and
    (A'-2) organohydrogenpolysiloxane comprising a compound of the formulae $R_3SiO(R_2SiO)_i(RHSiO)_jSiR_3$      (IV), $R_2HSiO(R_2SiO)_k(RHSiO)_lSiR_2H$      (V), or a combination thereof,
        where each R is independently independently a monovalent organic group, subscript i has an average value ranging from 0 to 2000, subscript j has an average value ranging from 2 to 2000, subscript k has an average value ranging from 0 to 2000, and subscript l has an average value ranging from 0 to 2000, wherein the mole ratio of the alkenyl group in component (A'1) and the silicon-bonded hydrogen atom in component (A'2) is in the range of 10:1 to 1:10.

4. The composition according to claim 1, wherein component (A) is cured.

5. The composition according to claim 1, wherein component (B) comprises a silicone and/or a silane.

6. The composition according to claim 5, wherein component (B) is selected from the group consisting of alkyl trialkoxysilane and alkenyl end-capped trialkoxysiloxy-terminated dimethylpolysiloxane.

7. The composition according to claim 6, wherein component (B) is selected from n-decyltrimethoxysilane and dimethylvinylsiloxy- and trimethoxysiloxy-terminated dimethylpolysiloxane.

8. The composition according to claim 1, wherein component (C) is phthalocyanine or metal phthalocyanine.

9. The composition of claim 1, further comprising an additional ingredient selected from (G) a spacer, (H) an antioxidant stabilizer, (I) a pigment, (J) a vehicle, or (K) a wetting agent, and a combination thereof.

10. The composition of claim 2 in which component (A) is a curable composition, further comprising (E) curing catalyst and/or (F) curing inhibitor.

11. A method comprising interposing the composition of claim 1 along a thermal path between a heat source and a heat dissipator.

12. The method of claim 11, where the heat source comprises an (opto)electronic component.

13. A device comprising:
    a) a heat source,
    b) a composition according to claim 1, and
    c) a heat dissipator;
where the composition is positioned between the heat source and the heat dissipator along a thermal path extending from a surface of the heat source to a surface of the heat dissipator.

* * * * *